March 15, 1966 L. L. EVANS 3,241,013

INTEGRAL TRANSISTOR PAIR FOR USE AS CHOPPER

Filed Oct. 25, 1962

Lee L. Evans
INVENTOR
BY John D. Graham
ATTORNEY

United States Patent Office
3,241,013
Patented Mar. 15, 1966

3,241,013
INTEGRAL TRANSISTOR PAIR FOR USE AS CHOPPER

Lee L. Evans, Santa Clara, Calif., assignor to Texas Instruments Incorporated, Dallas, Tex., a corporation of Delaware Filed Oct. 25, 1962, Ser. No. 233,091
3 Claims. (Cl. 317—235)

This invention relates to semiconductor devices, and more particularly to a device comprising a pair of integrally-connected transistors adapted for use as a switch or chopper.

A commonly-used low-level switch comprises a pair of transistors connected in series opposition between a source and a load. The collectors of the two transistors are connected together and the emitters provide the input and output terminals so that if the transistors are matched the collector-emitter voltage drops are canceled out. The transistors are simultaneously driven into either saturation or cut-off to close or open the switch. The base electrodes of the two transistors are ordinarily connected together and driving current is provided from the secondary winding of a transformer which is connected between the common base terminal and the common collector terminal. A switch or chopper typical of the prior art is shown in U.S. Patent 2,962,603, issued November 29, 1960 to R. L. Bright, particularly FIG. 2 of the patent.

The main problem inherent in a switch circuit of this type is to eliminate introduction of unwanted voltages into the signal circuit. If the transistor collector-emitter voltage drops are not equal, they will not cancel, so care must be taken in selecting transistors with matched off-set voltages for various levels of saturation and for a wide range of temperatures. The two transistors are ordinarily physically separated, so there may be a difference in ambient temperatures which will result in different saturation voltage drops. Even if the transistor wafers are mounted on the same header, thermal differences may be significant. Another difficulty is that the base drive currents must be carefully matched to produce the same level of saturation. This is ordinarily done by connecting like resistors in series with the base electrodes of the two transistors, but even then the drive current must be limited since the tendency for mismatch in off-set voltages will be greater as the drive current increases.

It is therefore the principal object of this invention to provide an improved switch of the type using a matched transistor pair, and particularly to eliminate introduction of extraneous voltages into the signal circuit of such a switch. Also, it is an object to provide a semiconductor device for use in a transistor switch wherein thermal differences are avoided and wherein the two switch elements may be driven at high levels with minimum off-set voltage differential.

In accordance with this invention, an integral pair of transistors is provided which functions as the two transistors in a switch or chopper. This device comprises a semiconductor wafer having a common collector region and a common base region for the two transistors, while two separate emitters are formed in or on the base region. Since the base-collector junction for the two transistors is common, the drive for the two transistors is inherently matched. The emitters, being formed simultaneously only a few mils from one another on a common base, can be as well matched as is theoretically possible. Also, due to the physical proximity of the devices, it is virtually impossible to generate significant thermal differences.

The novel features believed to be characteristic of this invention are set forth in the appended claims. The invention itself, however, along with further objects and advantages thereof, may be best understood by reference to the following detailed description of an illustrative embodiment, when read in conjunction with the accompanying drawing, wherein:

Figure 1:
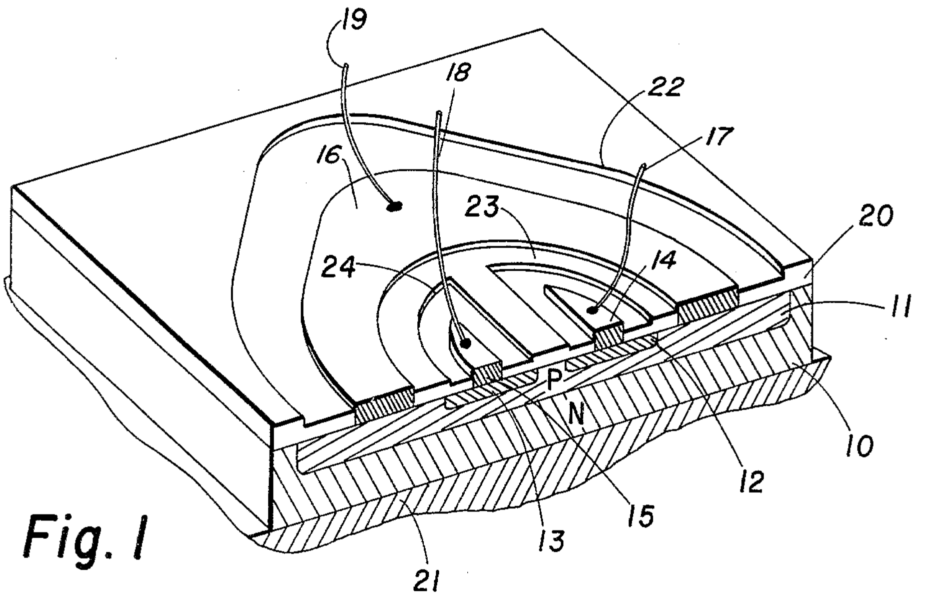
FIG. 1 is a pictorial view in section of an integral transistor pair employing the principal features of the invention.

With reference to FIG. 1, a semiconductor device is shown including a pair of integrally-connected, matched transistors having a common collector and a common base region but separate emitters. A wafer 10 of N-type silicon which provides the collector region for both transistors has a diffused P-type region 11 formed on the top surface, providing the base for both transistors. This region is tear-drop or pear-shaped in the illustrated embodiment, the purpose of this shape being to provide a wide area for the base contact. A pair of N-type diffused regions 12 and 13 are formed in the region 11 adjacent the wafer surface. These D-shaped regions 12 and 13 are the emitters of the two transistors and are matched in size, junction depth and impurity concentration. D-shaped ohmic contacts 14 and 15 are provided on the wafer surface over the emitter regions, by evaporated aluminum for example, and a ring-shaped contact 16 is made to the base region in a similar manner. Lead wires 17 and 18 are thermally bonded to the emitter contacts 14 and 15, respectively, and a wire 19 is bonded to the base contact 16. An oxide coating 20 is formed on the surface of the silicon wafer 10 during formation of the diffused regions and is left on the wafer to protect the junctions. Contact is made to the collector region by thermally bonding the wafer 10 to a conductive plate 21 which may be a conventional transistor header.

The device of FIG. 1 may be fabricated by the conventional double-diffusion process using oxide masking. A large slice of N-type silicon, of which the wafer 10 is only a small segment, would be cleaned and polished on the top surface and an oxide coating applied. A pattern of openings 22, each about 12 mils in diameter, would be formed in the oxide by photo-resist masking and etching, then a first diffusion operation is performed to produce the region 11. This P-type diffusion may comprise depositing boron on the wafer surface and heating to diffusion temperatures, about 1200° C., for several hours, producing a junction depth of perhaps 0.15 mil. The boron diffusion is masked by the silicon oxide, and the P-N junction extends to the wafer surface underneath the silicon oxide to be protected from contamination thereby. Another oxide coating is provided over the exposed surface during the first diffusion, and a pattern of D-shaped openings 23 and 24 is formed in this coating within what was previously the opening 22. These openings 23 and 24 each may be perhaps 7 mils long and 2½ mils wide, and would be spaced apart by about two mils. A second diffusion is then performed to produce the regions 12 and 13, and may consist of depositing phosphorus on the wafer surface and then heating to 1200° C. or more for a time adequate to produce junction depths of about 0.1 mil. The silicon oxide also masks the phosphorus diffusion, and the resulting P-N junctions are protected by the silicon oxide on the surface. Continuing with the fabrication process, openings are again provided in the silicon oxide in the areas where contacts are to be made. Aluminum is then deposited by evaporation into the exposed areas to provide the contacts 14, 15 and 16. The large slice is scribed and broken to produce a large number of the wafers 10, each having a transistor pair therein. The wafers are mounted on headers 21, the lead wires 17, 18 and 19 are attached, and the units are encapsulated.

Figure 2:
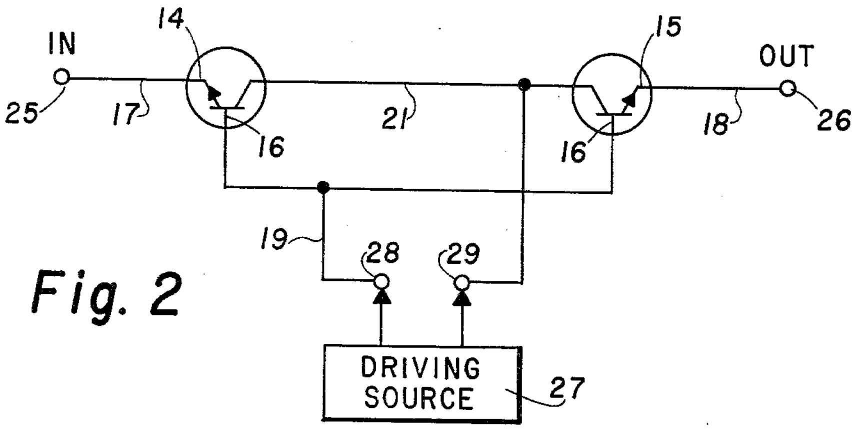
FIG. 2 is a schematic diagram of a switch circuit using the device of FIG. 1.

The devices of FIG. 1 are ordinarily used in a circuit of the type illustrated in FIG. 2, wherein like reference numerals designate the same parts as in FIG. 1. The emitter contact 17 of one transistor is connected to an input terminal 25 while the emitter contact 18 of the other transistor is connected to an output terminal 26. The switch circuit is effective to provide either an open circuit or a short circuit between the terminals 25 and 26, depending upon the driving voltage applied. The two transistors are simultaneously turned on or off by a voltage or current supplied from a driving source 27 to a pair of drive terminals 28 and 29. The terminal 28 is connected to the common base lead 19 which is connected to the base contact ring 16. The terminal 29 is connected to the common collector contact 21 which may be a transistor header. If the voltage between the contact 21 and the line 19 is positive, both transistors will be turned on or the switch will be closed, while a negative voltage will open the switch. The driving source 27 would typically include a pulse transformer for isolating the chopper transistors from ground.

While this invention has been described with reference to a specific embodiment, this description is merely illustrative of the principles underlying the inventive concept, and is not meant to be construed in a limiting sense. Various modifications of the illustrative embodiment, as well as other embodiments of the invention, will be obvious to persons skilled in the art upon reading this description. Accordingly, it is contemplated that the appended claims will cover any such modifications or embodiments as fall within the true scope of the invention.

What is claimed is:

1. A dual-emitter transistor device for use in a transistor switch comprising:

(a) a wafer of single-crystal semiconductor material, the wafer being predominantly of one conductivity-type and providing a common collector region, (b) a first region of the wafer providing a common base region, said first region being of the opposite conductivity-type and being located adjacent a major face of the wafer and contiguous to the material of said one conductivity-type, the interface between the first region and the bulk of the wafer being a P-N junction a major portion of which is substantially parallel to the major face, the first region being symmetrical about a central axis, (c) a second and a third region of the wafer of said one conductivity-type being substantially equal in area and adjacent the major face and contiguous to the first region so as to provide the emitters of the device, the second and third regions being spaced from the collector region and laterally spaced from one another in a manner symmetrical about said central axis, (d) a collector contact to the wafer on a face opposite said major face uniformly spaced from the first region, (e) a single ring-like base contact ohmically engaging the first region, said base contact substantially enclosing the second and third regions and being substantially equally spaced therefrom and symmetrical about said central axis, (f) and a pair of emitter contacts to the wafer engaging the second and third regions, respectively, and symmetrically spaced from the base contact.

2. A semiconductor device for use as a matched transistor pair in a transistor switch comprising:

(a) a wafer of single-crystal semiconductor material, (b) a first region of the wafer of one conductivity-type adjacent a major face of the wafer, (c) a second region of the wafer of the opposite conductivity-type adjacent the major face and contiguous to the first region, the interface between the first and second regions being a P-N junction a major portion of which is substantially parallel to the major face, the second region being symmetrical about a central axis, (d) a third and a fourth region of the wafer of said one conductivity-type being substantially equal in area adjacent the major face and contiguous to the second region, the third and fourth regions being spaced from the first region and laterally spaced from one another, in a manner symmetrical about said central axis, (e) a first ohmic contact to the first region at a position uniformly spaced from the second region, (f) a single ring-like ohmic contact to the wafer engaging the second region, said ring-like contact substantially enclosing the third and fourth regions and being substantially equally spaced therefrom and symmetrical about said central axis, (g) and third and fourth ohmic contacts to the wafer engaging the third and fourth regions, respectively, the third and fourth contacts being of the same shape and size and being symmetrically spaced from the ring-like contact.

3. A matched transistor pair for use in a transistor switch comprising a symmetrical dual-emitter transistor device including:

(a) a wafer of single-crystal semiconductor material, (b) a first region of the wafer of one conductivity-type adjacent a major face of the wafer providing a common collector region, (c) a second region of the wafer providing a common base region, the second region being of the opposite conductivity-type and being located adjacent the major face and contiguous to the first region, the interface between the first and second regions being a P-N junction a major portion of which is substantially parallel to the major face, the second region being symmetrical about a central axis which is parallel to the major face, (d) a third and a fourth region of the wafer of said one conductivity-type adjacent the major face and contiguous to the second region providing a pair of separate emitter regions which are of the same shape and size, the third and fourth regions being spaced from the first region and laterally spaced from one another in a manner symmetrical about said central axis, (e) a first ohmic contact to the first region at a position uniformly spaced from the second region providing a common collector electrode, (f) a ring-like ohmic contact to the wafer engaging the second region at a position equally spaced from the third and fourth regions and substantially enclosing the third and fourth regions, providing a common base electrode, the ring-like contact being symmetrical about said central axis, (g) and third and fourth ohmic contacts to the wafer engaging the third and fourth regions, respectively, the third and fourth contacts providing a pair of separate emitter electrodes which are equal in size and shape and symmetrically spaced from the ring-like contact.

References Cited by the Examiner

UNITED STATES PATENTS

| | | | |
|---|---|---|---|
| 2,666,814 | 1/1954 | Shockley | 317—235 |
| 2,924,760 | 2/1960 | Herlet | 317—235 |
| 2,937,960 | 5/1960 | Pankove | 148—1.5 |
| 2,981,877 | 4/1961 | Noyce | 317—235 |
| 2,985,804 | 5/1961 | Buie | 317—235 |
| 3,046,405 | 7/1962 | Emeis | 317—235 |
| 3,065,392 | 11/1962 | Pankove | 317—235 |
| 3,070,466 | 12/1962 | Lyons | 148—1.5 |
| 3,103,599 | 9/1963 | Henkels | 317—235 |
| 3,112,411 | 11/1963 | Cook | 317—235 |

DAVID J. GALVIN, *Primary Examiner.*

JAMES D. KALLAM, *Examiner.*